United States Patent [19]
Chevallier et al.

[11] Patent Number: 5,835,406
[45] Date of Patent: Nov. 10, 1998

[54] APPARATUS AND METHOD FOR SELECTING DATA BITS READ FROM A MULTISTATE MEMORY

[75] Inventors: Christophe J. Chevallier, Palo Alto; Vinod C. Lakhani, Milpitas, both of Calif.

[73] Assignee: Micron Quantum Devices, Inc., Santa Clara, Calif.

[21] Appl. No.: 736,380

[22] Filed: Oct. 24, 1996

[51] Int. Cl.$^6$ .............................. G11C 11/34; G11C 2/00
[52] U.S. Cl. .............. 365/185.03; 365/168; 365/189.02; 365/230.02
[58] Field of Search .................. 365/185.03, 189.02, 365/230.02, 205, 168

[56] References Cited

U.S. PATENT DOCUMENTS

| | | | |
|---|---|---|---|
| 5,043,940 | 8/1991 | Harari ....................................... | 365/168 |
| 5,233,610 | 8/1993 | Nakayama et al. ....................... | 371/5.1 |
| 5,394,362 | 2/1995 | Banks .................................. | 365/189.01 |
| 5,515,321 | 5/1996 | Hazama ............................. | 365/185.19 |
| 5,521,865 | 5/1996 | Ohuchi et al. .................. | 365/185.03 X |
| 5,570,315 | 10/1996 | Tanaka et al. .................. | 365/185.03 X |

OTHER PUBLICATIONS

Tae–Sung Jung et al. "TP 2.1: A 3.3V 128Mb Multi–Level NAND Flash Memory for Mass Storage Applications," IEEE International Solid–State Circuits Conference, 1996, pp. 32–33.

Masayoshi Ohkawa et al., "TP 2.3: A 98mm$^2$ 3.3V 64Mb Flash Memory with FN–NOR Type 4–level Cell," IEEE International Solid–State Circuits Conference, 1996, pp. 36–37.

Primary Examiner—David C. Nelms
Assistant Examiner—Huan Hoang
Attorney, Agent, or Firm—Limbach & Limbach L.L.P.

[57] ABSTRACT

An apparatus and method which sequentially selects subsets of data bits read in parallel from an array of memory cells (each cell being operated as a multistate memory device) and sequentially asserts the selected subsets to a data bus. Preferably, the cells are flash memory cells. Preferably, the apparatus includes a sense amplifier circuit, a multiplexer, and circuitry operable to read a number (N) of the cells in parallel, whether the cells are operated as binary or multistate devices. The sense amplifier has N input lines and MN output lines, where M is the number of binary bits in a binary representation of the data read from each cell operated as a multistate device. The multiplexer has MN inputs (each connected to one of the output lines of the sense amplifier circuit), N outputs connected to a data bus having N-bit width, and is controllable to output selected N-bit subsets of the MN bits received at its MN inputs. Another aspect of the invention is a memory system including such a multiplexer and read/write circuitry operable in a mode in which it writes data to selected cells of the array (leaving each cell in an erased or programmed state) or reads a binary data bit from each of N selected cells, where the read/write circuitry is also operable in another mode in which it writes data to selected cells of the array (leaving each cell in an erased state or a selected one of two or more possible programmed states) or reads data (indicative of an ordered set of at least two binary data bits) from each of N selected cells.

32 Claims, 5 Drawing Sheets

APPARATUS AND METHOD FOR SELECTING DATA BITS READ FROM A MULTISTATE MEMORY

TECHNICAL FIELD

The invention pertains to multistate memory systems and to methods and circuits for selecting bits that have been read from memory cells of such systems. More specifically, the invention is a method and system (and a circuit for use in such system) for sequentially selecting subsets of a set of data bits read in parallel from an array of flash memory cells (or other memory cells) operated as multistate memory devices, and sequentially asserting the selected subsets to a data bus.

BACKGROUND OF THE INVENTION

In conventional single-bit-per-cell memory systems (binary memory systems), each memory cell assumes one of two information storage states: either an "on" state or an "off" state. The state of each cell ("on" or "off") defines one binary bit of information. As a result, a binary memory system capable of storing N bits of binary data requires N separate memory cells.

Increasing the number of bits which can be stored using a binary memory system depends upon increasing the number of memory cells on a one-for-one basis with the number of bits of data to be stored. Methods for increasing the number of memory bits stored in a binary memory system have relied upon techniques such as manufacturing larger dies which contain more memory cells, or using improved photolithography techniques to build smaller memory cells. Reducing the size of a memory cell allows more cells to be placed on a given area of a single die.

An alternative to a binary memory system (which stores one binary bit per memory cell) is a multistate memory device which stores two or more binary bits of data in a single memory cell.

One type of memory device includes an array of electrically erasable and programmable devices known as flash memory cells. Each of such cells can be operated either as a binary memory device (storing one binary bit) or as a multistate memory device. To program a flash memory cell, appropriate voltages are applied to the source, drain, and control gate of the transistor which comprises the cell for an appropriate time period. This causes electrons to tunnel or be injected from a channel region to a floating gate. The amount of charge residing on the floating gate determines the voltage required on the control gate in order to cause the cell to conduct a particular level of current between the source and drain. This voltage is termed the threshold voltage, $V_{th}$, of the cell.

When a flash memory cell is operated as a binary memory device, the cell is programmed or erased to have a selected one of two different threshold voltages (the cell is either erased so as to have a first threshold voltage or it is programmed so as to have a second threshold voltage). The cell is then read by measuring whether the current between its source and drain (or a voltage related to such current) exceeds a threshold amount (for a known set of voltages applied to its source, control gate, and drain). Measurement of current having at least a first magnitude (a "first" current) between the source and drain regions determines an "on" or erased state of the cell (corresponding to a logic value of one). An "off" or programmed state of the cell (corresponding to a logic value of zero) is determined by a measured current less than the first current between the source and drain regions. For a given threshold voltage of a cell, the cell can be made to conduct or not conduct current (i.e., current greater than or equal to the first current) by applying a given set of voltages thereto. The cell conducts when a voltage applied to its control gate (with reference to its source voltage) is greater than the threshold voltage. By measuring whether a cell conducts current (i.e., current greater than or equal to the first current) at a given set of applied voltages, the state of the cell (programmed or erased) is measured. Typically, such a measurement is made using a sense amplifier (as described below).

When a flash memory cell is operated as a multistate memory device, the cell is programmed or erased to cause it to have a selected one of three or more different threshold voltages. In other words, the cell is either erased (so as to have a first threshold voltage), or it is programmed into one of at least two programmed states (so as to have a second threshold voltage in one programmed state, or a third threshold voltage in another programmed state, or a fourth threshold voltage in a third one of the programmed states, and so on). Each distinct threshold voltage corresponds to a set of at least two binary data bits in the following sense. Application of a voltage less than a first threshold voltage to the cell's control gate causes conduction of less than a first current between the source and drain regions (corresponding to a first set of binary bits, e.g., "00" or "000"), application of a voltage greater than the first threshold voltage but less than a second threshold voltage to the cell's control gate causes conduction of more than the first current but less than a second current between the source and drain regions (corresponding to a second set of binary bits, e.g., "01" or "001"), application of a voltage greater than the second threshold voltage but less than a third threshold voltage to the cell's control gate causes conduction of more than the second current but less than a third current between the source and drain (corresponding to a third set of binary bits, e.g., "10" or "010"), application of a voltage greater than the third threshold voltage to the cell's control gate causes conduction of more than the third current between the source and drain (corresponding to a fourth set of binary bits, e.g., "11" or "011"), and so on. This effectively allows multiple bits of binary data to be stored within a single memory cell.

When reading the state of a memory cell (operated as a multistate memory device), a binary decoded value (an ordered set of two or more binary bits indicative of the data stored in the cell) is generated which corresponds to a measured current between the cell's source and drain (or a measured voltage related to such current). Typically, the voltage related to the source-to-drain current is measured using sense amplifier circuitry to which a set of preselected reference voltage values (each corresponding to one of the threshold voltages) are applied, in a manner to be explained with reference to FIG. 3 below.

Memory system 3 shown in FIG. 1 includes an array 16 of nonvolatile memory cells (which can be flash memory cells), and is an example of a memory system which can be operated as a multistate memory system. Memory system 3 is implemented as an integrated circuit. Memory cell array 16 comprises rows and columns of memory cells (each row of cells connected along a different wordline, and each column of cells connected along a different bitline). Memory chip 3 also includes row decoder circuit (X address decoder) 12 and column multiplexer circuit (Y multiplexer) 14 connected to array 16.

Wordlines of array 16 are conveniently referred to as being numbered consecutively from top to bottom of array 16, so that the wordlines are: wordline 0 (or "WL0"), wordline 1 (or "WL1"), wordline 2, ..., wordline n−1, and wordline n (where n is an integer).

FIG. 2 is a schematic diagram of an implementation of memory array 16 of FIG. 1 from which data can be read in accordance with the present invention. The FIG. 2 implementation of array 16 includes flash memory cells arranged in rows and columns. Each cell is implemented by a floating-gate N-channel transistor (e.g., transistors N1, N3, and Nn connected along bitline 13), as shown schematically. All the cells in a particular column have their drain regions connected to a common bitline (e.g., bitline 13 or bitline 15) and all the cells in a particular row have their control gates connected to a common wordline (one of wordlines WL0, WL1, ..., WLn). The source region (S) of each of the cells is connected to a common source line SL. Alternatively, it is possible to arrange the cells into array segments having separate source lines that can be sequentially accessed during an erase cycle (e.g., to reduce the maximum erase current). The drain region (D) of each cell is connected to the bitline associated with the column in which the cell is located. For example, cell N1 has its drain region connected to bitline 13.

The control gate of each of the cells is driven by a driver circuit (not shown in FIG. 2 but included within X decoder circuit 12 of FIG. 1) which asserts an appropriate control voltage to such control gate.

The sources of the cells held by circuit 16 at a selected source potential (which is usually ground potential for the chip during a read or programming operation).

With reference to FIG. 1, memory chip 3 also includes control engine (or "controller") 29, output buffer 20, input buffer 18, and input/output pin (or pins) 30. Each pin 30 can assert data from output buffer 20 (e.g., data read from array 16) to an external device (not shown), and can receive input data from the external device. Input buffer 18 receives input data from pin(s) 30 and asserts the data to controller 29 and to Y-multiplexer 14, which cause the data to be written to array 16.

Address buffers A0 through Ap receive address bits from the external device. Some of the address buffers are configured to send buffered address bits to row decoder circuit 12 in response to receiving address bits from the external device, and others of the address buffers are configured to send buffered address bits to column multiplexer circuit (Y multiplexer) 14 in response to receiving address bits from the external device.

Each of the cells of memory array 16 is indexed by a row index (an "X" index determined by decoder circuit 12) and a column index (a "Y" index determined by a Y decoder circuit within circuit 14). As described with reference to FIG. 2, each column of cells of array 16 comprises "n" memory cells (where n is an integer), with each cell implemented by a single floating-gate N-channel transistor. The drains of all transistors of a column are connected to a bitline, the control gate of each of the transistors is connected to a different wordline, and the sources of the transistors are held at a source potential (which is usually ground potential for the chip during a read or programming operation).

Each memory cell is a nonvolatile memory cell since the transistor of each cell has a floating gate capable of semi-permanent charge storage. The current drawn by each cell (i.e., by each of the N-channel transistors) depends on the amount of charge stored on the cell's floating gate. Thus, the charge stored on each floating gate determines a data value that is stored "semipermanently" in the corresponding cell.

Where each of the N-channel transistors is a flash memory device, the charge stored on the floating gate of each is erasable (and thus the data value stored by each cell is erasable) by appropriately changing the voltage applied to the gate and source (in a well known manner). In memory systems comprising an array of non-volatile memory cells other than flash memory cells, such non-volatile cells are erased using other techniques which are well known.

Controller 29 of chip 3 controls detailed operations of chip 3 such as the various individual steps necessary for carrying out programming, reading, and erasing operations. Controller 29 thus functions to reduce the overhead required of the external processor (not depicted) typically used in association with chip 3. In response to a command or commands (e.g., a command received at pin 30 and asserted through buffer 18 to controller 29), controller 29 causes chip 3 to operate as a multistate memory system, and in response to another command (or another set of commands) controller 29 causes chip 3 to operate as a binary memory system.

In order to be operable as a multistate memory system, chip 3 must include a source or sources of appropriate voltages for programming each cell of array 16 to a selected one of at least two different programmed states and erasing each cell to an erased state distinct from the programmed states (or chip 3 must be coupled to an external source or sources of such voltages).

Chip 3 executes a write operation as follows. Appropriate ones of the address bits (Ao through Ap) are asserted to decoder circuit 12 and Y multiplexer circuit 14. In response to these address bits, circuit 12 determines a row address which selects one row of cells and circuit 14 determines a column address (which selects one column, or a number of columns, of memory cells of array 16). The row and column address thus together select one or more target cells in one selected row. In response to control signals (indicative of a write command) supplied from controller 29, a signal indicative of data present at the output of input buffer 18 is asserted through circuit 14 to the target cell or cells of array 16 determined by the row and column address (e.g., to the drain of each such cell). Depending on the value of each of the data bits, the corresponding target cell is either programmed (to one of at least two different programmed states when chip 3 operates as a multistate memory, or to a single programmed state when chip 3 operates as a binary memory) or it remains in an erased state.

Chip 3 executes a read operation as follows. Appropriate ones of the address bits (Ao through Ap) are asserted to decoder circuit 12 and Y multiplexer circuit 14. In response to these address bits, circuit 12 determines a row address which selects one row of cells and circuit 14 determines a column address (which selects one column, or a number of columns, of memory cells of array 16). The row and column address thus together select one or more target cells in one selected row. In response to control signals (indicative of a read command) supplied from control unit 29, a current signal (a "data signal") indicative of a data value stored in each target cell of array 16 is supplied from the drain of each target cell through the bitline of the target cell and then through circuit 14 to sense amplifier circuit 19. Typically, eight target cells (in a single row) are read simultaneously, and thus eight data signals are supplied in parallel to sense amplifier circuit 19 and eight output signals are asserted in parallel from circuit 19 to output buffer 20. Each data signal is processed in sense amplifier circuit 19 to generate one of the output signals, and each output signal is buffered in output buffer 20 and then asserted through pin(s) 30 to an external device. More generally, sense amplifier circuit 19 has L input lines and X output lines (where numbers L and X are explained below).

We next describe the manner in which sense amplifier circuit 19 processes a data signal from a selected target cell of array 16, with chip 3 operating as a binary memory system (i.e., with each cell of array 16 operating as a binary memory device). Predetermined voltages are applied to the wordline, bitline, and source of the selected cell, while the data signal (indicative of the source-to-drain current of the selected cell) is asserted to sense amplifier circuit 19. If the selected cell is in an erased state, the cell conducts a first current and the data signal indicative of this current is converted to a first voltage in circuit 19. If the selected cell is in the programmed state, it conducts a second current and the data signal indicative of this current is converted to a second voltage in circuit 19 (the "second current" flowing through a programmed cell is negligibly small when the cell is read by a typical, conventional read operation). Sense amplifier circuit 19 determines the state of the cell (i.e., whether it is programmed or erased corresponding to a binary value of 0 or 1, respectively) by comparing the voltage indicative of the cell state to a single reference voltage (supplied to circuit 19 in response to one or more control signals from controller 29). Circuit 19 asserts an output signal indicative of the outcome of this comparison (the output is either high or low, corresponding to a binary value of one or zero) to output buffer 20.

We next describe the manner in which sense amplifier circuit 19 processes a data signal from a selected target cell of array 16, with chip 3 operating as a multistate memory system (i.e., with each cell of array 16 operating as a multistate memory device). A predetermined voltage (e.g., 7 volts) is applied to the control gate of the selected cell (i.e., to the wordline of array 16 along which the selected cell is connected) while the data signal (indicative of the source-to-drain current of the selected cell) is asserted to sense amplifier circuit 19. If the selected cell is in an erased state, the cell conducts a first current and the data signal indicative of this current is converted to a first voltage in circuit 19. If the selected cell is in a first programmed state, it will conduct a different current which is converted to a second voltage in sense amplifier circuit 19. If the cell is in a second programmed state, it will conduct yet another current which is converted to a third voltage in sense amplifier circuit 19. In general, for each programmed state of the cell, the cell will conduct a distinctive current which is converted to a distinctive voltage ("VCELL") in sense amplifier circuit 19. Sense amplifier circuit 19 determines the state of the cell by comparing the voltage VCELL to each of a set of reference voltages (the reference voltages are supplied to circuit 19 in response to control signals from controller 29). Sense amplifier circuit 19 then generates encoded data (an ordered set of binary bits) indicative of the outcome of the comparisons.

We describe a case in which each cell is in one of four states (an erased state and three programmed states) with reference to FIG. 3 (which is a block diagram of a portion of an implementation of sense amplifier circuit 19). The FIG. 3 implementation of circuit 19 includes three comparator circuits (50, 51, and 52), each for comparing the voltage (VCELL) indicative of the cell state to a different reference voltage (V1, V2, or V3). Comparator 50 outputs voltage V4 which is either high or low (corresponding to a binary value of one or zero) depending on whether VCELL is less than or greater than reference voltage V1. Comparator 51 outputs voltage V5 which is either high or low (corresponding to a binary value of one or zero) depending on whether VCELL is less than or greater than reference voltage V2. Comparator 52 outputs voltage V6 which is either high or low (corresponding to a binary value of one or zero) depending on whether VCELL is less than or greater than reference voltage V3. Logic circuitry 53 receives voltage signals V4, V5, and V6, and asserts a signal $E_i$ indicative of an ordered set of two binary bits in response thereto. Circuitry 53 typically has two output lines (as indicated in FIG. 3) which assert two parallel signals determining the binary bits indicated by signal $E_i$.

Still with reference to FIG. 3, voltage VCELL is an analog voltage signal having a magnitude in a value range, where the value range is a member of a sequence of non-overlapping value ranges $L_1H_1$, $L_2H_2$, $L_3H_3$, and $L_4H_4$. The value ranges are determined by low values $L_i$ and high values $H_i$ satisfying $L_i < H_1 < V1 < L_2 < H_2 < V2 < L_3 < H_3 < V3 < L_4 < H_4$.

Each signal $E_i$ is indicative of an ordered set of two binary bits. In one example: $E_1$ is indicative of 00; $E_2$ is indicative of 01; $E_3$ is indicative of 11; and $E_4$ is indicative of 10.

In one implementation of the FIG. 1 system in which each cell of array 16 is a flash memory cell, each data signal (generated while reading one of the memory cells) received by sense amplifier circuit 19 (which includes the FIG. 3 circuit) is an analog current signal. Circuit 19 generates analog voltage signal (VCELL) from each such data signal, and the four states of each cell are defined as follows: VCELL<V1; V1<VCELL<V2; V2<VCELL<V3; and V3<VCELL.

More generally, when chip 3 is operating as a multistate memory system (each memory cell of which has one of three or more possible states, including an erased state), the data read from each cell cannot be represented by a single binary bit. Instead, circuit 19 outputs a signal ($E'_i$) indicative of an ordered set of at least two binary bits, in order to represent the data read from each cell. The bits indicated by signal $E'_i$ need not be (although they can be, in special cases) identical to those indicated by above-discussed signal $E_i$. Typically, many cells of array 16 are sequentially read (either one cell at a time, or X cells at a time, where X is a small integer such as eight), and during such a sequential read, sense amplifier circuit 19 outputs either: a signal indicative of a sequence of binary bit sets $S'_i$, each bit set $S'_i$ consisting of binary bits read during one time period (Ti) from a cell of array 16 (where only a single cell is read at each instant); or two or more signals in parallel, each signal indicative of a sequence of binary bit sets $S'_{ij}$ (where multiple cells, connected along a single wordline, are read at each instant), each bit set $S'_{ij}$ consisting of binary bits read from a cell in a column determined by index "j" during a time period Ti determined by index "i." Each group of bit sets $S'_{ij}$ (for fixed value of index "i" and for all values of index "j" in a range from 1 to X) consists of X sets of data bits, each set read simultaneously from a cell in a different column (the "j"th column) of array 16. For fixed value of index "j" (and for all values of index "i" in a range from 1 to Z), each group of bit sets $E'_{ij}$ is a sequence of Z sets of data bits, each set read at a different time from a cell in a single column (the "j"th column) of array 16.

However, in conventional multistate memory systems such as those discussed above, the sense amplifier circuit had a fixed number (L) of input lines (each of which could be coupled to a different column of cells) and fixed number (X) of output lines. When the cells were operated as binary memory devices (each cell having two possible states), no more than the lesser of L and X of the cells could be read simultaneously. Thus, where X=2 L, only L of the cells could be read simultaneously. When the cells were operated as multistate memory devices (each cell having four possible states), X=2 L output lines were required to read L cells simultaneously. Undesirably, an undesirably wide output bus (consisting of X=2 L output lines) was required for read a given number (e.g., L=8) of cells simultaneously. Conversely, in order to reduce the cost of implementing the system by using a relatively narrow output bus (e.g., by requiring that X not exceed 8), it was necessary to reduce system capability by restricting the number of simultaneously readable cells to an undesirably low number (e.g., L=4, where X=8) even in the case that the cells were operated as binary memory devices.

It had not been known until the present invention how to implement a multistate memory system so that desired subsets of data bits could be read from a selected cell or set of cells (of an array of flash memory cells or other memory cells), when each cell is operated as a multistate memory device. Nor had it been known until the present invention how to implement a multistate memory system so that a narrow output bus could receive all bits read simultaneously from multiple cells (connected along bitlines and wordlines) in an operating mode in which each cell operates as a multistate memory device, without degrading system capability by unduly restricting the number of cells that could be read simultaneously in an operating mode in which the cells operate as binary memory devices.

SUMMARY OF THE INVENTION

Preferred embodiments of the present invention are methods and apparatus which sequentially select different subsets of data bits read simultaneously (in parallel) from an array of memory cells being operated as multistate memory devices, and sequentially assert the selected subsets to a data bus. Preferably, the apparatus is also operable in a mode in which it selects all the data bits that have been read in parallel from the array while the cells are operated as binary memory devices. Another aspect of the invention is a memory system which includes such an apparatus, and also includes read/write circuitry operable in a binary mode in which it writes data to selected cells of the array (leaving each selected cell in an erased or programmed state) or reads a binary data bit from each of one or more selected cells of the array, wherein the read/write circuitry is also operable in a multistate mode in which it writes data to selected cells of the array (leaving each selected cell in an erased state or in a selected one of two or more possible programmed states) or reads data (indicative of an ordered set of at least two binary data bits) from each of one or more selected cells of the array.

In preferred embodiments, each cell is a flash memory cell, and the invention is a memory system including a sense amplifier circuit, a multiplexer, and circuitry which is operable to read a number (N) of the cells in parallel regardless of whether the cells are operated as binary or multistate storage devices. The sense amplifier has N input lines and MN output lines, where M is the number of binary bits in the binary representation of the data read from each cell operated as a multistate storage device. The multiplexer has MN inputs (each connected to one of the output lines of the sense amplifier circuit) and N outputs connected to a data bus having N-bit width. The multiplexer is controllable to output selected N-bit subsets of the MN bits received at its MN inputs. Preferably, in response to appropriate control signals, the multiplexer operates in a mode in which it sequentially outputs the N highest order bits of the MN bits received at its MN inputs, followed by the N next highest order bits of the MN bits received at its inputs, and so on until it outputs the N lowest order bits of the MN bits received at its inputs.

In a class of preferred embodiments, M=2 and N=8, each cell of the array is operable as a multistate storage device (having four possible states) or as a binary storage device (having two possible states), the sense amplifier circuit outputs a set of sixteen parallel binary bits to indicate the data stored in each of eight simultaneously read cells (when the cells are operated as multistate devices), and the sense amplifier circuit outputs a set of eight parallel binary bits to indicate the data stored in each of eight simultaneously read cells (when the cells are operated as binary devices). In response to appropriate control signals (when the cells are operated as multistate devices), the multiplexer sequentially outputs the eight highest order bits of each set of 16 bits received at its inputs, followed by the eight lowest order bits of each said set of 16 bits.

Another embodiment of the invention is a bit selection circuit, including a sense amplifier circuit and a multiplexer as described, for use in a memory system. Other embodiments of the invention are methods performed during operation of the described memory system and bit selection circuit.

DETAILED DESCRIPTION OF THE INVENTION

Figure 4:
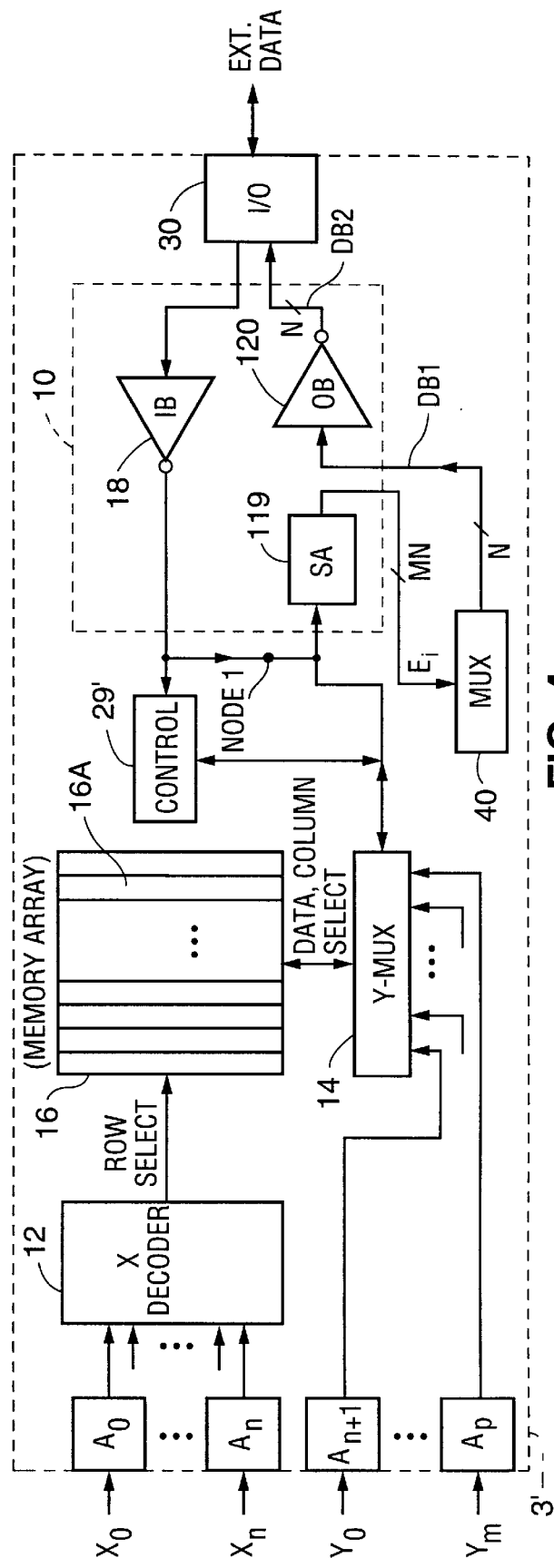
FIG. 4 is a block diagram of a preferred embodiment of the memory system of the invention, which can operate as a multistate memory system or a binary memory system.

With reference to FIG. 4, multistate memory system 3' is a preferred embodiment of the inventive memory system which is implemented as an integrated circuit (and thus sometimes referred to as memory chip 3'). Memory chip 3' is identical to chip 3 of FIG. 1 except in that:

sense amplifier circuit 119 of chip 3' (which replaces sense amplifier circuit 19 of chip 3) has N input lines and MN output lines, and includes circuitry for simultaneously processing (in parallel) measured current signals from N columns of array 16 (or measured voltages related to such current signals) to generate binary representations of data read from N cells of array 16 (one cell in each column), where M is the number of binary bits in the binary representation of the data read from each cell (operated as a multistate storage device), and MN is the product of N and M;

output buffer 120 of chip 3' (which replaces output buffer 20 of chip 3) includes buffer circuitry which receives N parallel streams of output bits from multiplexer 40 (indicative of data read from array 16) and asserts N buffered output bits on data bus DB2 (which has N-bit width) to I/O pins 30;

chip 3' includes multiplexer circuit 40, whose MN inputs are connected to the MN outputs of sense amplifier circuit 119, and whose N outputs are connected by N-bit wide data bus DB1 to the N inputs of output buffer 120; and controller 29' of chip 3' (which replaces controller 29 of chip 3) differs from controller 29 in that controller 29' is programmed to assert control signals to elements 119 and 40 as needed to implement the invention, and to cause assertion to element 119 of all reference voltages that are needed to implement the invention.

Figure 1:
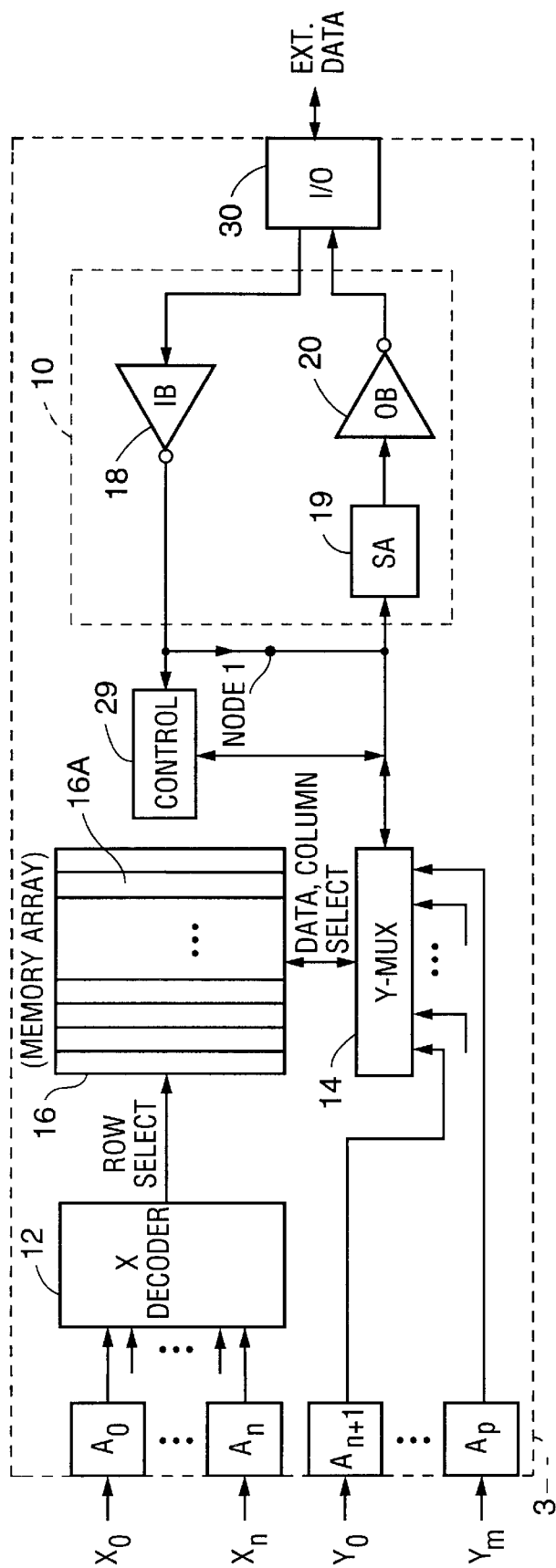
FIG. 1 is a block diagram of a conventional memory system which is operable as a multistate memory system or a binary memory system.
Figure 2:
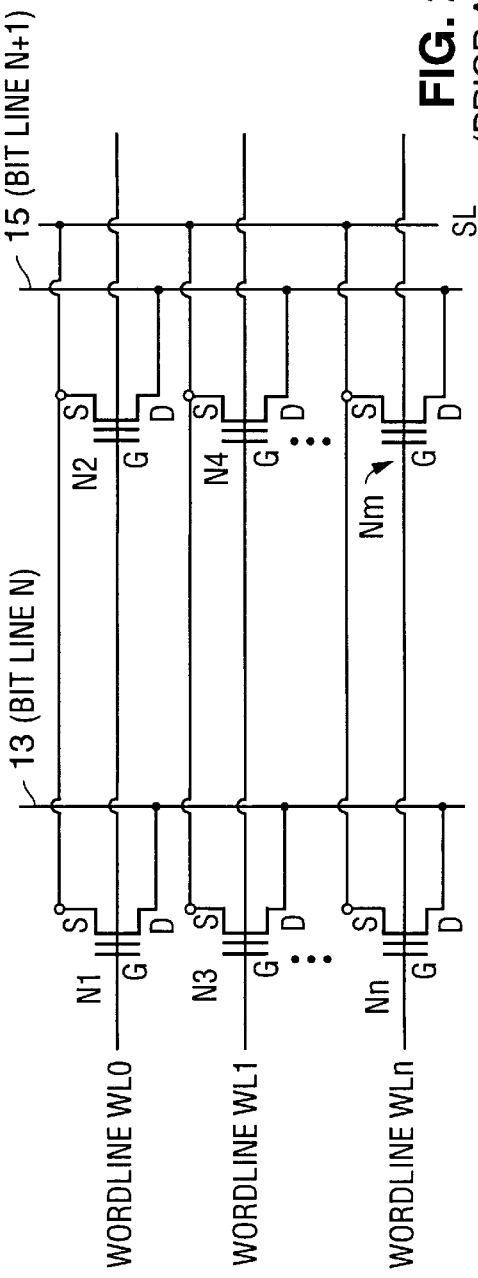
FIG. 2 is a schematic diagram of a portion of a typical implementation of array 16 of FIG. 1.

The other elements of chip 3' (of FIG. 4) are identical to corresponding elements of chip 3 (which are identically numbered in FIGS. 1 and 4). The description of these elements set forth above with reference to FIG. 1 will not be repeated below.

Preferably, the read/write circuitry of chip 3' (including controller 29' and circuits 12, 14, and 119) is designed and programmed to execute read operations (in the multistate mode) in the manner described in U.S. patent application Ser. No. 08/735,915, entitled "APPARATUS AND METHOD FOR PROGRAMMING MULTISTATE MEMORY DEVICE," filed Oct. 24, 1996 (Attorney Docket No. MCRN-F1500), the text of which is incorporated herein by reference.

Figure 3:
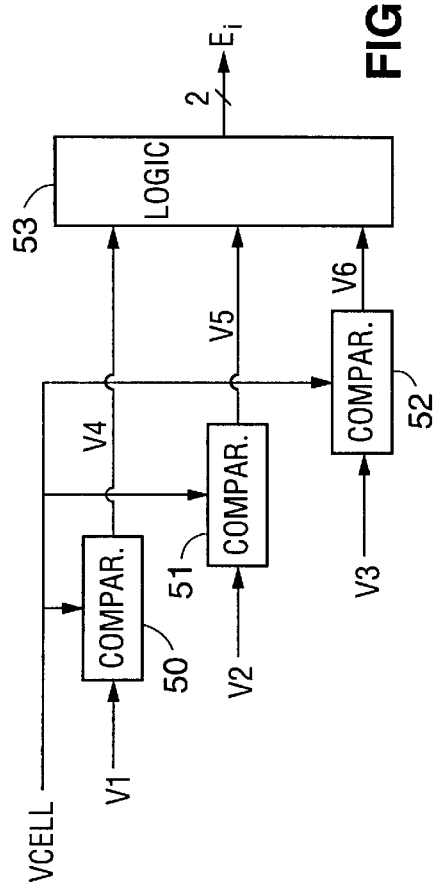
FIG. 3 is a block diagram of a portion of a conventional implementation of sense amplifier circuit 19 of FIG. 1.

In one class of embodiments, sense amplifier circuit 119 includes N circuits of the type shown in FIG. 3, connected in parallel so that each of the N input lines of circuit 119 receives a voltage VCELL from a different column of array 16. An example of such an embodiment is sense amplifier circuit 219 shown in FIG. 5 (which can be used to implement circuit 119 of FIG. 4 in cases in which N=8). Sense amplifier circuit 219 includes eight circuits (labeled as circuits 2191, 2192, 2193, 2194, 2195, 2196, 2197, and 2198 in FIG. 5), each of which is identical to that shown in FIG. 3 and receives a measured voltage (one of signals D1 through D8) through Y multiplexer circuit 14 from a different one of eight selected columns of array 16. In the FIG. 5 embodiment, each of signals D1 through D8 is received from a different column of array 16 and each corresponds to voltage VCELL of FIG. 3 received from a different column of array 16. By including sense amplifier circuit 219 shown in FIG. 5, the memory system of the invention can operate simultaneously on the bits of an eight-bit byte of binary data (e.g., to read the binary bits of an eight-bit byte of binary data in parallel from array 16 or write the binary bits of an eight-bit byte of binary data in parallel to array 16).

With reference again to FIG. 4, the cells of array 16 can be operated either as multistate memory devices or binary memory devices (as described above). An advantage of the invention is that use of multiplexer 40 with sense amplifier circuit 119 enables the system to read N cells of array 16 (in N different columns of array 16) simultaneously while using narrow (N-bit wide) output data buses DB1 and DB2, regardless of whether the cells are being operated as multistate memory devices or binary memory devices. In the latter operating mode (in which the cells are operated as multistate memory devices), sense amplifier circuit 119 generates MN binary bits as a result of reading N cells of array 16 (and decoding each of the N measured signals to generate M binary bits determined such measured signal), and multiplexer 40 time-division multiplexes the MN binary bits generated by sense amplifier circuit 119 by sequentially asserting N-bit subsets of these MN binary bits to bus DB1. In the former operating mode (in which the cells are operated as binary memory devices), multiplexer 40 passes through all N binary bits output from sense amplifier circuit 119 (as a result of reading N cells of array 16).

Thus, in accordance with the invention, chip 3' is a multistate memory system implemented with a narrow output bus (e.g., bus DB1 having N-bit width) that receives all bits read simultaneously from N memory cells (connected along bitlines and wordlines or array 16) in an operating mode in which each cell operates as a multistate memory device, without degrading system capability by unduly restricting the number of cells that can be read simultaneously in an operating mode in which the cells operate as binary memory devices.

Figure 5:
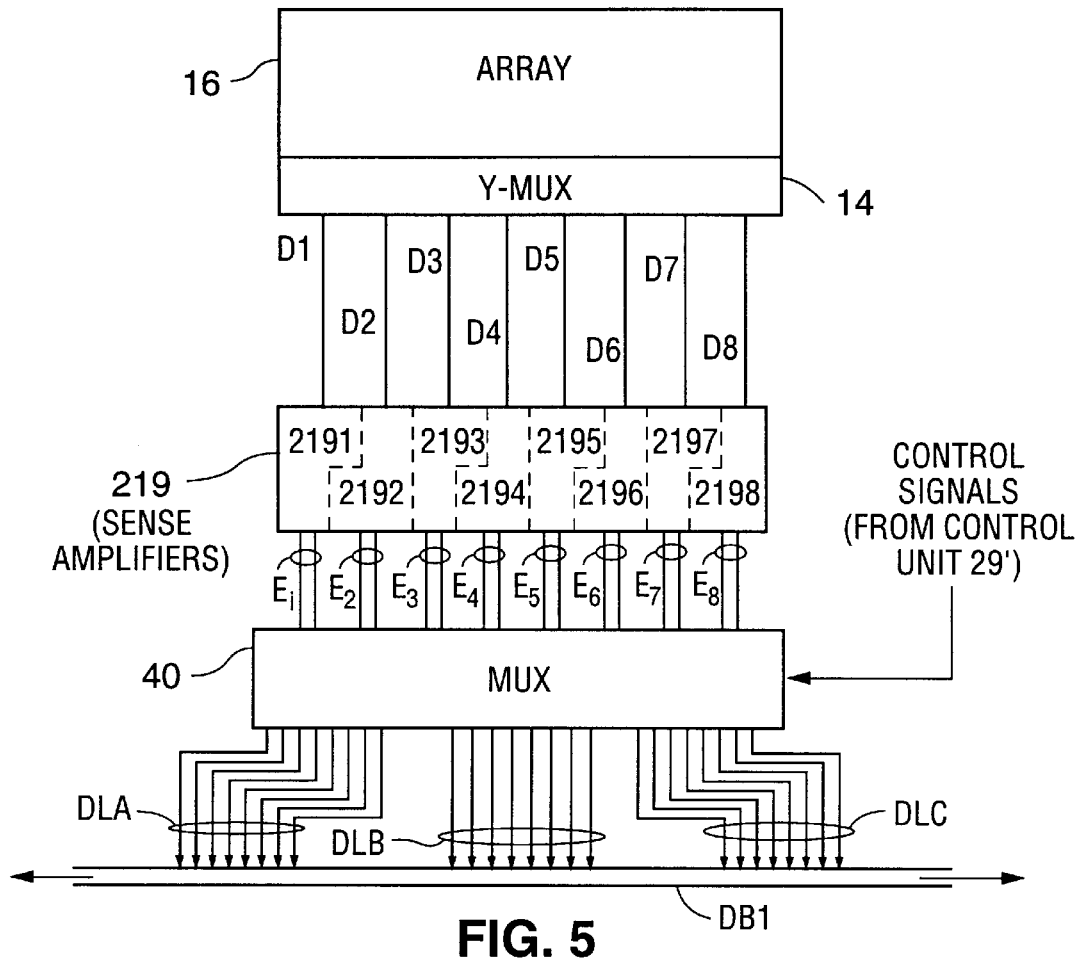
FIG. 5 is a block diagram of a portion of a preferred implementation of the system of FIG. 4.

We next describe operation of the preferred embodiment shown in FIG. 5 in more detail. In an operating mode in which the memory system (which includes array 16 and circuits 219 and 40) reads eight cells of array 16 (one selected cell in each of eight columns of array 16) while the cells are operated as multistate memory devices (each storing one of four possible data values), sense amplifier circuit 219 receives eight measured voltage signals, D1, D2, D3, D4, D5, D6, D7, and D8. Each of signals D1–D8 is indicative of the source-to-drain current of the selected cell in a different one of the columns. Sense amplifier circuit 219 includes eight circuits (labeled as circuits 2191, 2192, 2193, 2194, 2195, 2196, 2197, and 2198 in FIG. 5), each of which receives one of signals D1–D8. Preferably, each of circuits 219$i$ (where "i" is an integer in the range from 1 through 8) is identical to circuit 219$i$ shown in FIG. 7 (to be described below). Circuit 2191 decodes signal D1, thereby generating an ordered set of two binary bits $E_1$ indicative of the stored data value determined by signal D1 (binary bit set $E_1$ is asserted to multiplexer 40 on two of the sixteen output lines of circuit 219). Similarly, circuits 2192, 2193, 2194, 2195, 2196, 2197, and 2198 of circuit 219 decode signals D2, D3, D4, D5, D6, D7, and D8, respectively, thereby generating seven ordered sets of two binary bits $E_2$, $E_3$, $E_4$, $E_5$, $E_6$, $E_7$, and $E_8$, each of these bit sets being indicative of the stored data value determined by the relevant one of signals D2, D3, D4, D5, D6, D7, and D8. Each two-bit set of binary bits $E_2$, $E_3$, $E_4$, $E_5$, $E_6$, $E_7$, and $E_8$ is asserted to multiplexer 40 on a different pair of the sixteen output lines of circuit 219.

In response to control signals from control unit 29', multiplexer 40 asserts the low order sets of bits ($E_1$, $E_2$, $E_3$, and $E_4$) of the two-bit binary bit sets $E_1$, $E_2$, $E_3$, $E_4$, $E_5$, $E_6$, $E_7$, and $E_8$ to bus DB1 (during a first clock cycle), and then asserts the high order sets of bits ($E_5$, $E_6$, $E_7$, and $E_8$) of the two-bit binary bit sets to bus DB1 (during a subsequent clock cycle). The high order bit sets $E_5$–$E_8$ (each of which represents one byte stored in four cells of the array) are collectively denoted as bits "DLB" in FIG. 5, and the low order bit sets $E_1$–$E_4$ (each of which represents one byte stored in four cells of the array) are collectively denoted as bits "DLC" in FIG. 5. Thus, multiplexer 40 time-division multiplexes each set of sixteen binary bits generated by sense amplifier circuit 219 by sequentially asserting 8-bit subsets of these sixteen binary bits to bus DB1.

In alternative embodiments, multiplexer 40, in response to control signals from control unit 29', asserts the higher order bit of each of the two-bit binary bit sets $E_1$, $E_2$, $E_3$, $E_4$, $E_5$, $E_6$, $E_7$, and $E_8$ to bus DB1 (during a first clock cycle), and then asserts the lower order bit of each of the two-bit binary bit sets $E_1$, $E_2$, $E_3$, $E_4$, $E_5$, $E_6$, $E_7$, and $E_8$ to bus DB1 (during a subsequent clock cycle). In such embodiments, eight cells of the array store two bytes, with each cell storing one bit from each of two different bytes (no four-cell subset of the eight cells stores an entire byte).

In an operating mode in which the system reads eight cells of array 16 (one selected cell in each of eight columns of array 16) while the cells are operated as binary memory devices (each storing one of two possible data values), sense amplifier circuit 219 receives eight measured voltage signals, D1, D2, D3, D4, D5, D6, D7, and D8. Each of signals D1–D8 is indicative of the source-to-drain current of the selected cell in a different one of the eight columns. Circuit 2191 of circuit 219 generates a single binary bit indicative of the stored data value determined by signal D1, and asserts this binary bit to multiplexer 40 on one of the two output lines on which it asserts two-bit set $E_1$ in the above-described multistate operating mode. Similarly, circuits 2192, 2193, 2194, 2195, 2196, 2197, and 2198 of circuit 219 process signals D2, D3, D4, D5, D6, D7, and D8, respectively, thereby generating seven binary bits (each indicative of the stored data value determined by the relevant one of signals D2, D3, D4, D5, D6, D7, and D8), and assert these seven bits to multiplexer 40. In response to control signals from control unit 29', multiplexer 40 passes through all eight of the binary bits it receives from sense amplifier circuit 219 (these bits are collectively denoted as bits "DLA" in FIG. 5).

Figure 6:
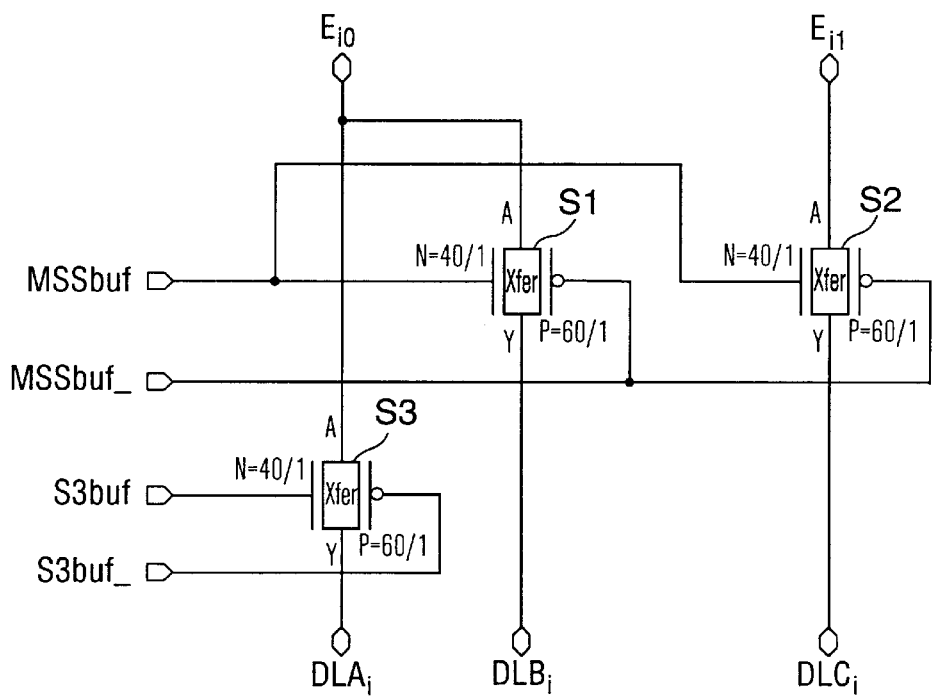
FIG. 6 is a schematic diagram of a portion of multiplexer 40 of FIG. 5.

FIG. 6 is a schematic diagram of a portion of a preferred implementation of multiplexer 40 of FIG. 5. This implementation of multiplexer 40 would consist of eight of the circuits shown in FIG. 6: one for receiving each set $E_i$ of two binary bits output from sense amplifier circuit 219. Each set $E_i$ of binary bits ("i" is an integer in the range from 1 through 8) consists of lower order binary bit $E_{i0}$ and higher order binary bit $E_{i0}$, as shown in FIG. 6. Binary bit $E_{i0}$ is supplied to each of pass transistor switches S1 and S3, and binary bit $E_{i0}$ is supplied to pass transistor switch S2. Each of pass transistor switches S1, S2, and S3 consists of a PMOS transistor and an NMOS transistor connected as shown.

In response to control signals from control unit 29' in the system's multistate operating mode (in which each cell of array 16 is operated as a four-state storage device), switch S3 is maintained in an open state (preventing assertion of bit $E_{i0}$ to output line $DLA_i$), and switches S1 and S2 are alternatingly placed in open and closed states, as follows:

during one cycle, both switches S1 and S2 in four of the FIG. 6 circuits within multiplexer 40 are caused to be open, and switches S1 and S2 in the other four of the FIG. 6 circuits within multiplexer 40 are caused to be closed; and during the next cycle, both switches S1 and S2 in the first four of the FIG. 6 circuits in multiplexer 40 are kept closed, and switches S1 and S2 in the other four of the FIG. 6 circuits in multiplexer 40 are kept open.

More specifically, signal MSSbuf (and its inverse, MSSbuf_) from controller 29' are applied to the control gates of switches S1 and S2 to control the state of switches S1 and S2, and signal S3buf (and its inverse, S3buf_) from controller 29' are applied to the control gates of switch S3 to control the state of switch S3. These signals and the control process will be further described below with reference to FIG. 7

As a result, multiplexer 40 outputs binary bits $E_{10}$, $E_{11}$, $E_{20}$, $E_{21}$, $E_{30}$, $E_{31}$, $E_{40}$, and $E_{41}$ (collectively denoted as bits "DLB" in FIG. 5) to data bus DB1 in one cycle, and multiplexer 40 outputs binary bits $E_{50}$, $E_{51}$, $E_{60}$, $E_{61}$, $E_{70}$, $E_{71}$, $E_{80}$, and $E_{81}$ (collectively denoted as bits "DLC" in FIG. 5) to data bus DB1 in the next cycle. Two cycles are required to assert to bus DB1 all sixteen binary bits ($E_{i0}$ and $E_{i1}$) which determine a complete set of data read in parallel from eight selected cells of array 16.

In response to control signals from control unit 29', switch S3 is maintained in a closed state and each of switches S1 and S2 is maintained in its open state (in each of the FIG. 6 circuits within multiplexer 40) during the system's binary operating mode. Thus, multiplexer 40 outputs only the higher order binary bits $E_{i0}$ (collectively denoted as bits "DLA" in FIG. 5) to data bus DB1. The higher order binary bits $E_{i0}$ determine the eight binary bits read in parallel from the eight selected cells of array 16.

Figure 7:
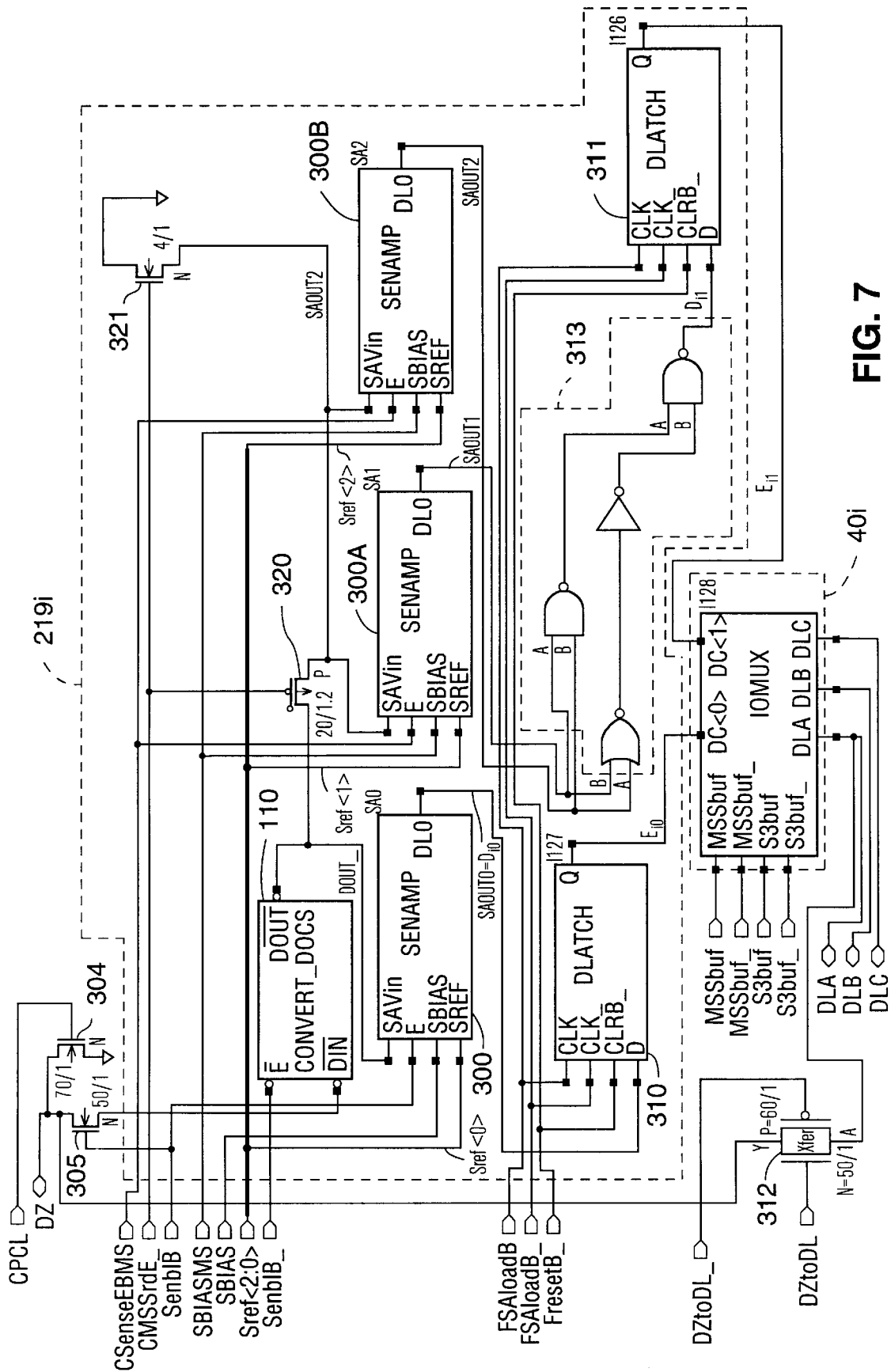
FIG. 7 is a schematic diagram of a portion of sense amplifier circuit 219 of FIG. 5, and a block diagram of a corresponding portion of multiplexer 40 of FIG. 5.

FIG. 7 is a schematic diagram of portion 219i (one of identical portions 2191, 2192, 2193, 2194, 2195, 2196, 2197, and 2198) of sense amplifier circuit 219 of FIG. 5, with a block diagram of corresponding portion $40_i$ of multiplexer 40 of FIG. 5. Portion $40i$ (which can be identical to the above-described FIG. 6 circuit) receives set $E_i$ of two binary bits ($E_{i0}$ and $E_{i1}$) output from sense amplifier circuit 219i.

Figure 8:
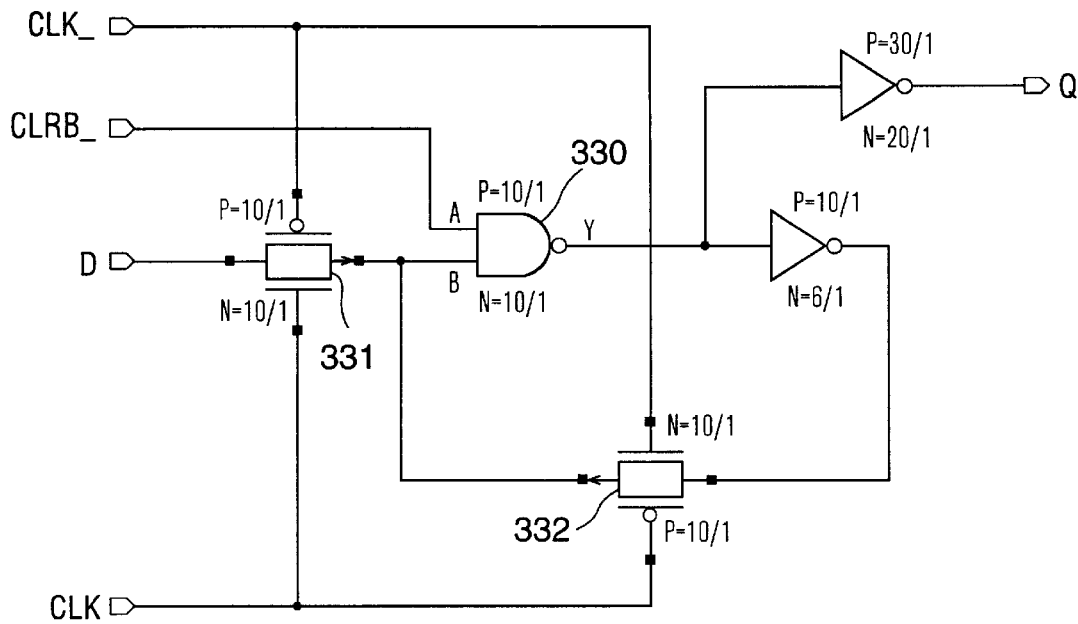
FIG. 8 is a schematic diagram of latch circuit 310 (or latch circuit 311) of FIG. 7.

Circuit 219i of FIG. 7 includes three identical sense amplifiers 300, 300a, and 300b. Each of sense amplifiers 300, 300a, and 300b is a two-stage differential amplifier. SBIAS, the signal used to bias each differential amplifier is generated outside of circuit 219 and can be common to all of sense amplifiers 300, 300a, and 300b. When transistor 305 is enabled by a high level of the sense amplifier enable signal "SenblB," current from data line DZ (connected to the selected bit line of array 16 to be read using the FIG. 7 circuit) flows through transistor 305 to an input of conversion circuit 110. Circuit 110 converts this current (from the accessed memory cell in array 16) to a voltage (labeled "DOUT_" in FIG. 7) which is applied to a first input (labeled "SAVin") of sense amplifier 300, and also through transistor 320 (in the multistate mode in which signal CMSSrdE_ is low) to a first input (labeled "SAVin") of each of sense amplifiers 300a and 300b. Reference voltages Sref<0>, SRef<1>, and SRef<2> are asserted from bus SRef<2:0> to a second input of sense amplifier 300, a second input of sense amplifier 300a, and a second input of sense amplifier 300b, respectively. The outputs of sense amplifiers 300, 300a, and 300b (labelled "SAOUT0", "SAOUT1", and "SAOUT2," respectively) are gated as shown to provide the binary bit set $E_{i0}$, $E_{i1}$. More specifically, output signal SAOUT0 is data bit $D_{i0}$, which is prevented from being asserted to circuit 40i by data latch 310, until latch 310 is placed in a state in which it passes through data bit $D_{i0}$ to circuit 40i as the output data bit $E_{i0}$. Output signals SAOUT1 and SAOUT2 are combined in logic circuit 313 to generate data bit $D_{i1}$, which is prevented from being asserted to circuit 40i by data latch 311, until latch 311 is placed in a state in which it passes through data bit $D_{i1}$ as the output data bit $E_{i1}$. Data latches 310 and 311 are preferably identical, and each is preferably as the FIG. 8 circuit. Application of a control signal (labeled "FSAloadB" in FIG. 7) and its inverse (labeled "FSAloadB_" in FIG. 7) to lines CLK and CLK_ (and thus to the control gates of pass transistor switches 331 and 332 of FIG. 8) at a desired time causes the input voltage received on line D (data bit $D_{i0}$ or $D_{i1}$) to be output from the FIG. 8 circuit at such desired time. A reset signal (labeled "FresetB_" in FIG. 7) received on line CLRB_ (and supplied to one input of NAND gate 330 of FIG. 8) resets the FIG. 8 circuit.

The signal "CPCL" controls the gate of transistor 304 to cause data line DZ to be discharged (through transistor 304) prior to performing a read operation. The signal labeled "DZtoDL" (and its inverse "DZtoDL__") signal 308 controls gate 312, which is used to bypass the FIG. 7 circuitry (to connect data line DZ, at desired times, to the output line on which bit DLA$_i$ is normally asserted). Gate 312 can be placed in a closed state (to bypass the FIG. 7 circuit) in certain test modes when it is desired to bring the memory array bit lines directly to an outside pad, to allow direct measurement of the current flowing through the memory cells.

Table 1 summarizes the usage of signals identified in FIG. 7.

TABLE 1

| Signal Name | Signal Purpose | Multistate Read Mode | Binary Read Mode | Program Mode (Binary or Multistate) |
|---|---|---|---|---|
| Sref0 | reference voltage 0 | mid trip point | mid trip point | don't care |
| Sref1 | reference voltage 1 | low trip point | don't care | don't care |
| Sref2 | reference voltage 2 | high trip point | don't care | don't care |
| CMSSrdE__ | Enables Multistate Read Mode (active low) | low | high | high |
| Sbias | sense amp bias (for amp 300) | active | active | low |
| SBIASMS | sense amp bias (for multistate amps 300a and 300b) | active | low | low |
| SenblB | sense amp enable (for amp 300) | high | high | low |
| CSense-EBMS | multistate sense amp enable (for amps 300a and 300b) | high | low | low |
| MSSbuf | multistate read mux control | controlled by AMS | low | low |
| S3buf | binary read mux control | low | high | low |
| AMS | multistate address | high/low | don't care | low |
| AMS__ | | low/high | don't care | high |

During the system's binary read mode (when data is read from cells of array 16 being operated as binary storage devices), sense amp 300a and sense amp 300b are disabled. Signals SBIASMS and CSenseEBMS are low, and signal CMSSrdE__ is high. During the binary read mode, SAOUT1 and SAOUT2 (the outputs of sense amps 300a and 300b) are grounded by CSenseEBMS being low. When signal CMSSrdE__ is high, sense amps 300a and 300b are isolated by transistor 320 from the output of circuit 110 by transistor 320, and instead transistor 321 grounds the "SAVin" input terminals of sense amps 300a and 300b.

When reading eight cells of array 16 in parallel in the binary read mode, sense amplifier 219 outputs eight bits (DLA) are outputted, which go through eight output buffers (within element 120 of FIG. 4) to eight output pads. When reading eight cells of array 16 in the multistate read mode, sense amplifier 219 outputs sixteen bits (DLB and DLC). Since it is desired to use only eight output pads of chip 3' (e.g., where the chip interfaces with an external data bus of eight-bit width), and to use internal data buses having eight-bit width (e.g., bus DB1), the sixteen bits read in parallel during the multistate read mode are time-division multiplexed using multiplexer 40. A control signal ("Address Multistate" or "AMS") which corresponds to an extra address bit, is used to select either a first eight-bit subset of bits DLB and DLC, or a second eight-bit subset of bits DLB and DLC, as the output of multiplexer 40 at any one time.

Figure 9:
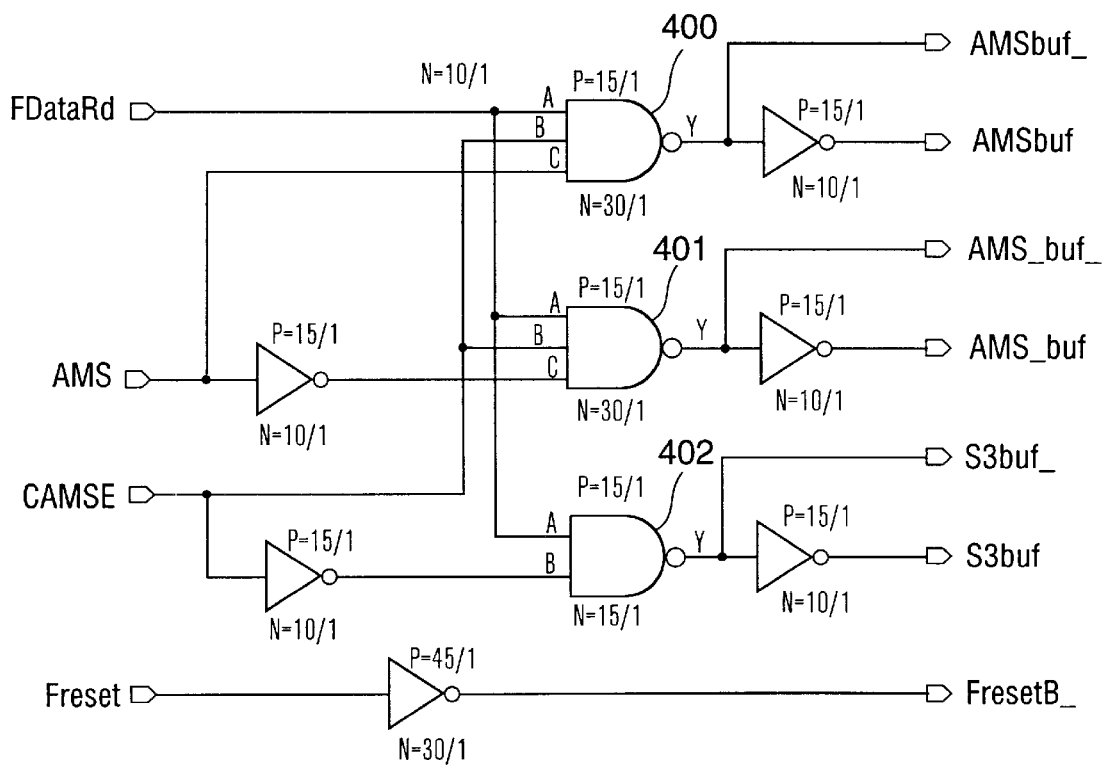
FIG. 9 is a diagram of logic circuitry which is in controller 29'.

Controller 29' preferably includes logic circuitry for generating described control signals MMSbuf and S3buf (and their inverses, MMSbuf__ and S3Buf__) in response to control signal AMS. FIG. 9 is a diagram of such logic circuitry. With reference to FIG. 9, control signal CAMSE is high when the system operates in a multistate mode (and it is low when the system operates in a binary mode), and control signal FDataRd is an enable signal which is high when the system executes a read operation, and is low when the system executes a write operation. Control signals FDataRd, AMS, and CAMSE are supplied to the inputs of NAND gate 400. Control signals FDataRd and CAMSE and the inverse of AMS are supplied to the inputs of NAND gate 401. Control signal FDataRd and the inverse of CAMSE are supplied to the inputs of NAND gate 402. In response, the FIG. 9 circuit asserts the following control signals at its outputs (as shown): AMSbuf (and its inverse AMSbuf__), AMS__buf (and its inverse AMS__buf__), and S3buf (and its inverse S3buf__).

Control signals AMSbuf and AMSbuf__ are supplied to the four highest order blocks of multiplexer circuitry 40$i$ (i.e., blocks 40$_5$, 40$_6$, 40$_7$, and 40$_8$) as control signals MMSbuf and MMSbuf__, and control signals AMS__buf and AMS__buf__ are supplied to the four lowest order blocks of multiplexer circutry 40$i$ (i.e., blocks 40$_1$, 40$_2$, 40$_3$, and 40$_4$) as control signals MMSbuf and MMSbuf__. Control signals S3buf and S3buf__ are supplied to all eight blocks 40$i$ of the multiplexer circutry 40$_i$.

During a multistate read mode, the FIG. 9 circuit causes S3buf to be low. When AMS is low (during a multistate read mode) the FIG. 9 circuit causes MMSbuf to be high for the first four multiplexer circuits 40$_1$, 40$_2$, 40$_3$, and 40$_4$ of circuit 40 (and causes MMSbuf to be low for the four other multiplexer circuits 40$_5$, 40$_6$, 40$_7$, and 40$_8$ of circuit 40) during a first cycle, and then, when AMS is high, causes MMSbuf to be low for the first four multiplexer circuits 40$_1$, 40$_2$, 40$_3$, and 40$_4$ (and MMSbuf to be high for the four other multiplexer circuits 40$_5$, 40$_6$, 40$_7$, and 40$_8$) during the next cycle.

When the system is not in a read mode (e.g., when it is in a program mode), the FIG. 9 circuit causes MSSbuf and S3buf to be low for all the circuits 40$_i$, so that all the IOmux pass gates are off, and data bus DB1 will not be affected by circuits 219 and 40 (DLA, DLB, and DLC are all floating).

Data latches 310 and 311 are optionally provided to latch above-described binary bits D$_{i0}$ and D$_{i1}$. In a variation on the FIG. 7 circuit, latches 310 and 311 are omitted, data bit D$_{i0}$ is asserted (as data bit E$_{i0}$) directly to circuit 40$_i$, and data bit D$_{i1}$ is asserted (as data bit E$_{i1}$) directly to circuit 40$_i$. The advantage of using data latches 310 and 311 connected as in FIG. 7 is that they isolate the sensing operation (performed by amplifiers 300, 300a, and 300b) from the operation of data transfer on the system's data buses (e.g., so that data can be read out from multiplexer 40i to bus DB1 while a new set of memory cells are being sensed). The "FSAloadB" and "FSAloadB_" signals shown in FIG. 7 clock out each new data bit ($D_{i0}$ or $D_{i1}$) from one of data latches 310 and 311 at a desired time after a sense operation is completed.

Table 2 shows the sense amplifier outputs (signals SAOUT2, SAOUT1, and SAOUT0) and corresponding bit sets ($D_{i0}$ $D_{i1}$) for the memory array cell threshold voltage values for each of the four possible cell states being sensed by the FIG. 7 circuit.

TABLE 2

| Cell $V_t$ | State | SAOUT2 | SAOUT1 | SAOUT0 | Bit Set ($D_{i0}$ $D_{i1}$) |
|---|---|---|---|---|---|
| less than 3 V | Erased | 1 | 1 | 1 | 1 1 |
| 4 to 4.5 V | Programmed state A | 1 | 0 | 1 | 1 0 |
| 5 to 5.5 V | Programmed state B | 1 | 0 | 0 | 0 0 |
| >6 V | Programmed state C | 0 | 0 | 0 | 0 1 |

As explained, the embodiment of FIGS. 5–7 enables sixteen bits to be read during a single two-cycle read operation in the multistate mode, compared to eight bits during a one-cycle read operation in the binary mode. Although the multistate read may need to be somewhat slower than the binary read (to take into account the narrower memory cell margins inherent in multistate operation), the multistate read can read two eight-bit bytes in almost the same amount of time as a binary read can read one eight-bit byte. The decoding (and time-division multiplexing) of the two bytes in multiplexer 40 (controlled by switching signal AMS during the multistate read mode) can be done at twice the rate at which the cells are read. This provides a significant overall speed improvement over the binary read mode. Alternatively, the following improvement results if the inventive system is operated with the same data output rate for binary and multistate reads: a multistate read can be done twice as slowly as a binary read (of the same number of cells), and the extra time can be used to ensure that the threshold voltage levels of the multistate cells being read are properly decoded.

In the above-described embodiment of FIGS. 5–7, each memory cell is operated as a 4-state cell in the multistate read mode (or the multistate program mode). In alternative embodiments, each memory cell is operated as an 8-state cell in the multistate read mode, the sense amplifiers would output an ordered set of three binary bits from each cell being read, and three cycles would be required to time-division multiplex the binary bits read onto an 8-bit data bus in accordance with the invention.

Preferred embodiments of the invention have been described with reference to FIGS. 4–8. Although these embodiments have been described in some detail, it is contemplated that changes from these embodiments can be made without departing from the spirit and scope of the invention as defined by the appended claims.

What is claimed is:

1. A memory system, comprising:

an array of memory cells, each of the cells having an erased state and at least two programmed states;

read/write circuitry coupled to the array and configured to operate in a multistate mode, wherein during a write operation in the multistate mode the read/write circuitry writes data to selected ones of the cells thereby leaving each of the selected ones of the cells in an erased state or a selected one of the programmed states, and during a read operation in the multistate mode the read/write circuitry reads a data signal indicative of an ordered set of M binary data bits from each cell of at least a subset of the selected ones of the cells, where M is an integer greater than one; and a multiplexer coupled to the read/write circuitry to receive each said data signal, wherein the multiplexer is configured to select, during the multistate mode, a sequence of different subsets of each said ordered set of M binary data bits.

2. The system of claim 1, also including:

a data bus having N-bit width connected to the multiplexer, wherein the read/write circuitry reads N of the cells during the read operation in the multistate mode thereby generating N ordered M-bit sets of said binary data bits, and wherein the multiplexer has MN input lines for receiving said N ordered M-bit sets in parallel, and the multiplexer is configured to select, during the multistate mode, a sequence of M different N-bit subsets of said N ordered M-bit sets and to assert to the data bus a set of N parallel output signals indicative of each of the N-bit subsets.

3. The system of claim 2, wherein M=2.

4. The system of claim 2, wherein M=2 and N=8.

5. The system of claim 2, wherein the read/write circuitry is configured to be operable in a selected one of a binary mode and the multistate mode, wherein during a write operation in the binary mode the read/write circuitry writes data to selected ones of the cells thereby leaving each of the selected ones of the cells in one of the erased state and a first programmed state, and during a read operation in the binary mode the read/write circuitry reads a binary data bit from each of at least a subset of the selected ones of the cells, thereby generating a set of binary data bit signals, and asserts the set of binary data bit signals in parallel to the multiplexer, and wherein the multiplexer is configured to pass through to the data bus each said set of binary data bit signals received in parallel from the read/write circuitry during the binary mode.

6. The system of claim 1, wherein the read/write circuitry includes a sense amplifier circuit coupled to the array, wherein the sense amplifier circuit receives a status signal from each cell in the subset of the selected ones of the cells during the read operation in the multistate mode, and wherein the sense amplifier circuit is configured to generate the data signal for each selected cell in response to the status signal for said each selected cell.

7. The memory system of claim 1, also including:

at least one latch circuit connected between the sense amplifier circuit and the multiplexer to receive each said data signal from the sense amplifier circuit, wherein said at least one latch circuit is configured to assert each said data signal to the multiplexer in response to a control signal.

8. The memory system of claim 1, wherein the memory cells are flash memory cells.

9. A circuit for use in a memory system, wherein the system is operable in a multistate mode, wherein during a write operation in the multistate mode the system writes data to selected memory cells thereby leaving each of the selected memory cells in an erased state or a selected one of at least two programmed states, and wherein during a read operation in the multistate mode the system generates at least one data signal indicative of an ordered set of M binary data bits from each of at least a subset of the selected memory cells, where M is an integer greater than one, the circuit comprising:

a sense amplifier circuit configured to receive a status signal from each selected cell in the subset of the selected ones of the cells during the read operation in the multistate mode, and to generate said at least one data signal for said each selected cell in response to the status signal for said each selected cell; and a multiplexer coupled to the sense amplifier circuit to receive each said data signal, wherein the multiplexer is configured to select, during the multistate mode, a sequence of different subsets of each said ordered set of M binary data bits.

10. The system of claim 9, also including:

a data bus having N-bit width coupled to the multiplexer, wherein the sense amplifier circuit receives status signals from N of the cells during the read operation in the multistate mode and generates N ordered M-bit sets of said binary data bits, and wherein the multiplexer has MN input lines for receiving said N ordered M-bit sets in parallel from the sense amplifier circuit, and the multiplexer is configured to select, during the multistate mode, a sequence of M different N-bit subsets of said N ordered M-bit sets and to assert to the data bus a set of N parallel output signals indicative of each of the N-bit subsets.

11. The system of claim 10, wherein M=2.

12. The system of claim 10, wherein M=2 and N=8.

13. The memory system of claim 9, wherein the memory cells are flash memory cells.

14. A memory system, comprising:

an array of memory cells, each of the cells having an erased state and at least two programmed states;

read/write circuitry coupled to the array and configured to operate in a multistate mode, wherein during a write operation in the multistate mode the read/write circuitry writes data to selected ones of the cells thereby leaving each of the selected ones of the cells in an erased state or a selected one of the programmed states, and during a read operation in the multistate mode the read/write circuitry generates data signals, each of the data signals being indicative of an ordered set of M binary data bits read from a different one of N selected cells of the array, where M is an integer greater than one and N is a positive integer, wherein the read/write circuitry includes a sense amplifier circuit having N inputs coupled to the N selected cells to receive status signals from the N selected cells, wherein the sense amplifier circuit is configured to generate the data signals in response to the status signals during the read operation in the multistate mode, wherein the sense amplifier circuit has MN output lines for asserting N ordered M-bit sets which determine said data signals; and a multiplexer coupled to receive the N ordered M-bit sets from the sense amplifier circuit, wherein the multiplexer is configured to select during the multistate mode a sequence of M different N-bit subsets of the N ordered M-bit sets, wherein the multiplexer has MN input lines each of which is coupled to a different one of the MN output lines of the sense amplifier circuit.

15. The system of claim 14, wherein M=2.

16. The system of claim 14, wherein M=2 and N=8.

17. The memory system of claim 14, also including:

a data bus having N-bit width connected to the multiplexer, wherein the multiplexer is configured to assert to the data bus a set of N parallel output signals indicative of each of the N-bit subsets.

18. The system of claim 17, wherein the read/write circuitry is configured to be operable in a selected one of a binary mode and the multistate mode, wherein during a write operation in the binary mode the read/write circuitry writes data to selected ones of the cells thereby leaving each of the selected ones of the cells in one of the erased state and a first programmed state, and during a read operation in the binary mode the read/write circuitry receives status signals from N of the selected ones of the cells, wherein the sense amplifier circuit is configured to generate a set of N binary data bit signals in response to the status signals during the read operation in the binary mode and to assert the binary data bit signals in parallel to the multiplexer, and wherein the multiplexer is configured to pass through to the data bus each said set of binary data bit signals received in parallel from the sense amplifier circuit during the binary mode.

19. A method of reading data from an array of memory cells, wherein each of the cells is a multistate storage device having one of at least three states, said method including the steps of:

reading N of the cells in parallel, thereby generating N status signals, said status signals including a status signal from each of said N of the cells;

generating N ordered M-bit sets of binary data bits from the status signals, each of the M-bit sets being indicative of a data value stored in a different one of said N of the cells, where N is a positive integer and M is an integer greater than one and; and selecting a sequence of M different N-bit subsets of said N ordered M-bit sets.

20. The method of claim 19, also including the step of:

sequentially asserting each of the N-bit subsets of said N ordered M-bit sets to a data bus.

21. The method of claim 20, wherein the data bus has N-bit width.

22. The method of claim 19, wherein the memory cells are flash memory cells, and said at least three states include an erased state and at least two programmed states.

23. The method of claim 19, wherein M=2.

24. The method of claim 19, wherein M=2 and N=8.

25. The method of claim 19, wherein the step of selecting is performed by time-division multiplexing the N ordered M-bit sets in a multiplexer, and wherein the method also includes the steps of:

before the step of selecting, temporarily storing the N ordered M-bit sets in latch circuitry; and after the step of temporarily storing, but before the step of selecting, asserting the N ordered M-bit sets from the latch circuitry to the multiplexer in response to a control signal.

26. A method of selecting data read from an array of memory cells, where each of the cells is a multistate storage device having one of at least three states, said method including the steps of:

asserting N ordered M-bit sets of binary data bits to a multiplexer, each of the M-bit sets being indicative of a data value stored in a different one of N of the cells, where M is an integer greater than one and N is a positive integer; and time-division multiplexing the N ordered M-bit sets using the multiplexer, thereby selecting a sequence of M different N-bit subsets of said N ordered M-bit sets.

27. The method of claim 26, also including the step of:

sequentially asserting each of the N-bit subsets of said N ordered M-bit sets to a data bus.

28. The method of claim 27, wherein the data bus has N-bit width.

29. The method of claim 26, wherein the memory cells are flash memory cells, and said at least three states include an erased state and at least two programmed states.

30. The method of claim 26, wherein M=2.

31. The method of claim 26, wherein M=2 and N=8.

32. The method of claim 26, also including the steps of:

before the step of asserting, temporarily storing the N ordered M-bit sets in latch circuitry; and after the step of temporarily storing, asserting the N ordered M-bit sets from the latch circuitry to the multiplexer in response to a control signal.

* * * * *

UNITED STATES PATENT AND TRADEMARK OFFICE
CERTIFICATE OF CORRECTION

PATENT NO. : 5,835,406

DATED : November 10, 1998

INVENTOR(S) : Christophe J. Chevallier, Palo Alto; Vinod C. Lakhani, Milpitas, both of Calif.

It is certified that error appears in the above-identified patent and that said Letters Patent is hereby corrected as shown below:

At Col. 4, line 27, please delete "as follows." and insert with semicolon -- as follows; --

At Col. 4, line 46, please delete "as follows." and insert with semicolon -- as follows; --

At Col. 6, line 16, please delete "satisfying $L_i <$" and insert -- satisfying $L_1 <$ --

At Col. 8, line 48, please delete "29'." and insert -- 29' of FIG. 4. --

At Col. 14, line 41, please delete "eight blocks $40i$" and insert with subscript -- eight blocks $40_1$ --

Signed and Sealed this

Eighth Day of February, 2000

*Attest:*

Q. TODD DICKINSON

*Attesting Officer*  *Commissioner of Patents and Trademarks*